(12) United States Patent
Xue et al.

(10) Patent No.: US 12,261,101 B2
(45) Date of Patent: Mar. 25, 2025

(54) SEMICONDUCTOR PACKAGE HAVING WETTABLE LEAD FLANKS AND TIE BARS AND METHOD OF MAKING THE SAME

(71) Applicant: ALPHA AND OMEGA SEMICONDUCTOR INTERNATIONAL LP, Toronto (CA)

(72) Inventors: Yan Xun Xue, Los Gatos, CA (US); Madhur Bobde, Sunnyvale, CA (US); Long-Ching Wang, Cupertino, CA (US); Xiaoguang Zeng, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 392 days.

(21) Appl. No.: 17/852,356

(22) Filed: Jun. 28, 2022

(65) Prior Publication Data

US 2023/0420340 A1 Dec. 28, 2023

(51) Int. Cl.
*H01L 23/495* (2006.01)
*H01L 21/48* (2006.01)
*H01L 23/00* (2006.01)

(52) U.S. Cl.
CPC .... *H01L 23/49562* (2013.01); *H01L 21/4835* (2013.01); *H01L 21/4842* (2013.01); *H01L 23/49565* (2013.01); *H01L 23/49582* (2013.01); *H01L 23/49513* (2013.01); *H01L 24/40* (2013.01); *H01L 24/48* (2013.01); *H01L 24/73* (2013.01); *H01L 2224/40245* (2013.01); *H01L 2224/48245* (2013.01); *H01L 2224/73221* (2013.01); *H01L 2924/13091* (2013.01); *H01L 2924/182* (2013.01)

(58) Field of Classification Search
CPC .................................................. H01L 23/49562
USPC ....................................................... 257/666
See application file for complete search history.

(56) References Cited

U.S. PATENT DOCUMENTS

| | | | |
|---|---|---|---|
| 7,612,439 B2 | 11/2009 | Zhang et al. | |
| 7,781,265 B2 | 8/2010 | Zhang et al. | |
| 7,898,092 B2 | 3/2011 | Lu et al. | |
| 8,378,347 B2 | 2/2013 | Shimizu et al. | |
| 10,057,688 B2 | 8/2018 | Salmon | |
| 2008/0203548 A1 | 8/2008 | Sun et al. | |
| 2010/0148346 A1* | 6/2010 | Quinones | H01L 23/4334 257/676 |
| 2013/0313696 A1 | 11/2013 | Hsieh et al. | |
| 2014/0191334 A1 | 7/2014 | Xue et al. | |

(Continued)

*Primary Examiner* — Ajay Arora
(74) *Attorney, Agent, or Firm* — Chen-Chi Lin (57) ABSTRACT

A semiconductor package includes a lead frame, a chip, and a molding encapsulation. The lead frame comprises a die paddle, a first plurality of leads, additional one or more leads, a second plurality of leads, a first tie bar, a second tie bar, a third tie bar, and a fourth tie bar. A respective end surface of each lead of the first plurality of leads, the additional one or more leads, and the second plurality of leads is plated with a metal. A respective end surface of the first tie bar, the second tie bar, the third tie bar, and the fourth tie bar is not plated with the metal. A method for fabricating a semiconductor package includes the steps of providing a lead frame array, mounting a chip, forming a molding encapsulation, applying a trimming process, applying a plating process, and applying a singulation process.

13 Claims, 12 Drawing Sheets

(56) References Cited

U.S. PATENT DOCUMENTS

| | | |
|---|---|---|
| 2016/0173039 A1* | 6/2016 | Frei ................. H03F 1/0288 |
| | | 29/831 |
| 2016/0218254 A1 | 7/2016 | Lopez et al. |
| 2017/0271246 A1* | 9/2017 | Macheiner ........ H01L 23/49513 |
| 2022/0181239 A1 | 6/2022 | Lin |
| 2022/0199425 A1 | 6/2022 | Xue et al. |

* cited by examiner

SEMICONDUCTOR PACKAGE HAVING WETTABLE LEAD FLANKS AND TIE BARS AND METHOD OF MAKING THE SAME

FIELD OF THE INVENTION

This invention relates generally to a semiconductor package having a plurality of leads with wettable flanks and a plurality of tie bars and a method of making the same. More particularly, the present invention relates to a semiconductor package fabricated using a lead frame having a trimming process step before a plating process step.

BACKGROUND OF THE INVENTION

Conventional Quad-flat no leads (QFN) and Dual-flat no leads (DFN) micro lead packages comprise exposed copper at end surfaces of leads after a singulation process or a punching process. The exposed copper subjects to oxidation over time. The oxidized copper end surfaces degrades a solder connection quality after a reflow process to integrate the QFN packages and the DFN packages with a printed circuit board (PCB). It requires an automatic X-ray inspection (AXI) to check the quality of the solder connection. The AXI is expensive and complicated. US patent application publication US2017/0271246 to Macheiner et al. discloses a fully plated end face 104 of a lead and first and second unplated sidewalls 106a and 106b of the lead (see FIG. 1C of US patent application publication US2017/0271246).

The present disclosure provides a solution by introducing wettable, metal plated end surfaces of the leads of a semiconductor package and a plurality of tie bars, including QFN packages and DFN packages. The package of instant disclosure only requires an automatic optical inspection (AOI) to check the quality of the solder connection. AOI is much cheaper than AXI. The present disclosure also improves the board level reliability (BLR).

SUMMARY OF THE INVENTION

The present invention discloses a semiconductor package comprising a lead frame, a chip, and a molding encapsulation. The lead frame comprises a die paddle, a first plurality of leads, additional one or more leads, a second plurality of leads, a first tie bar, a second tie bar, a third tie bar, and a fourth tie bar. A respective end surface of each lead of the first plurality of leads, the additional one or more leads, and the second plurality of leads is plated with a metal. A respective end surface of the first tie bar, the second tie bar, the third tie bar, and the fourth tie bar is not plated with the metal.

A method for fabricating a semiconductor package is also disclosed. The method comprises the steps of providing a lead frame array, mounting a chip, forming a molding encapsulation, applying a trimming process, applying a plating process, and applying a singulation process.

DETAILED DESCRIPTION OF THE INVENTION

Figure 1:
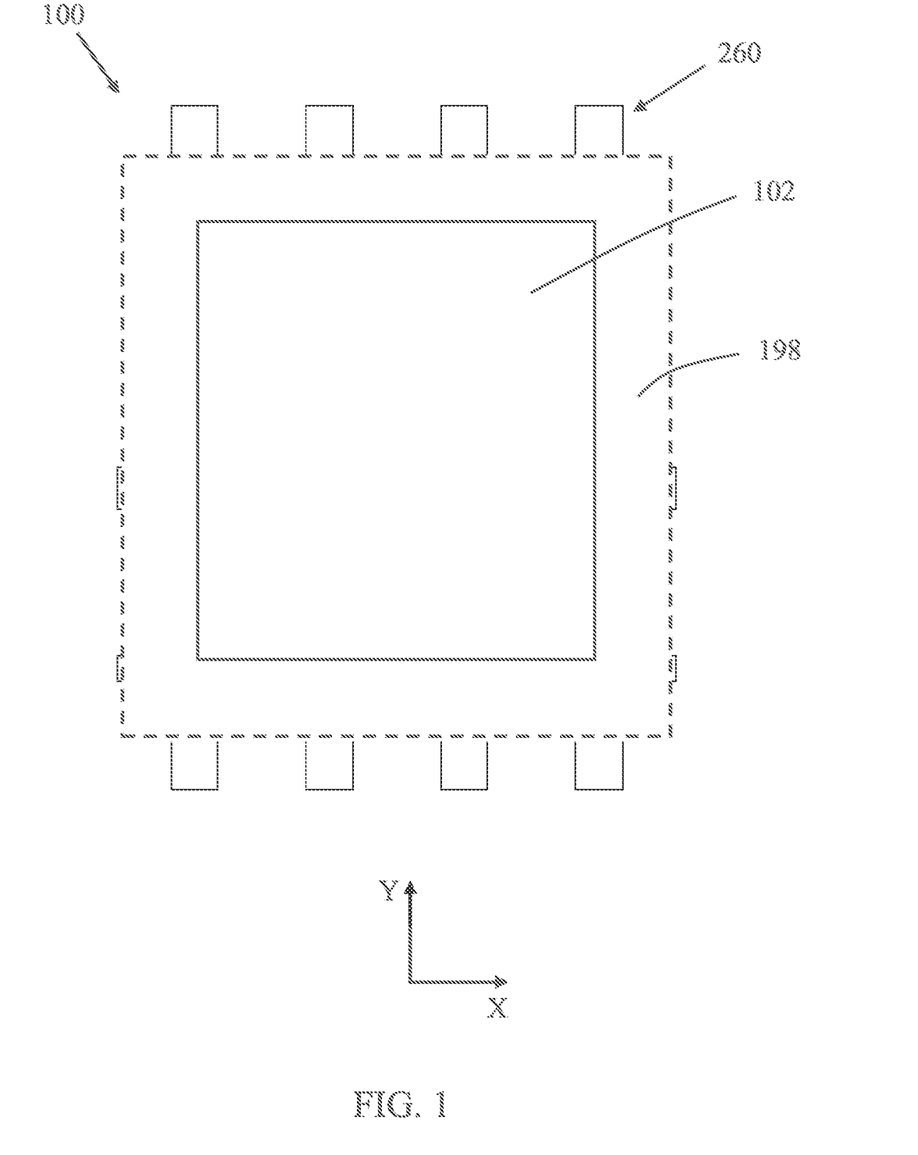
FIG. 1 a top view of a semiconductor package in examples of the present disclosure.
Figure 2:
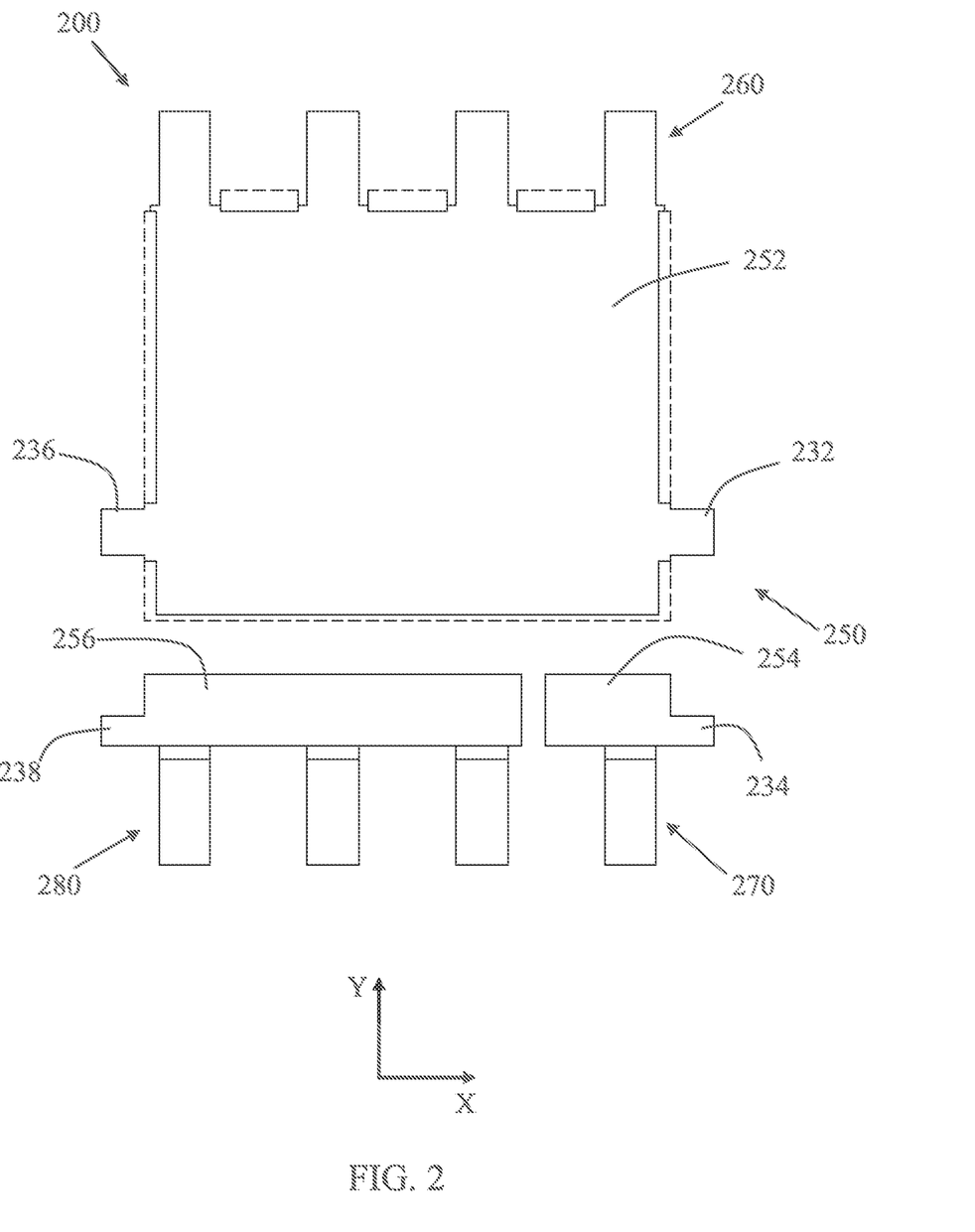
FIG. 2 shows a top view of a lead frame in examples of the present disclosure.

FIG. 1 shows a top view of a semiconductor package 100 in examples of the present disclosure. FIG. 2 shows a top view of a lead frame 200 in examples of the present disclosure. The semiconductor package 100 comprises a lead frame 200 of FIG. 2, a chip 102, and a molding encapsulation 198. The molding encapsulation 198 encloses the chip 102 (shown in dashed lines). A portion of a top surface of the lead frame 200 is covered by the molding encapsulation 198. In one example, an entirety of the top surface of the lead frame 200 is a flat plane. In another example, an entirety of the top surface of the lead frame 200 is not a flat plane.

Still referring to FIGS. 1 and 2, the lead frame 200 comprises a die paddle 250, and a first plurality of leads 260. The chip 102 is attached to the die paddle 250. The die paddle 250 comprises a first portion 252, a second portion 256, and a third portion 254. The second portion 256 is electrically isolated from the first portion 252. The third portion 254 is electrically isolated from the first portion 252 and the second portion 256. In examples of the present disclosure, a top surface of an outer peripheral of the die paddle 250 is of a rectangular shape. Though only one die paddle 250 is shown in FIG. 2, the number of die paddles may vary.

The first plurality of leads 260 extend from the first portion 252 of the die paddle 250 along a first direction (positive Y axis). A first tie bar 232 extends from the first portion 252 of the die paddle 250 along a second direction (positive X axis) perpendicular to the first direction (positive Y axis). A second tie bar 236 extends from the first portion 252 of the die paddle 250 along a third direction (negative X axis) opposite the second direction (positive X axis). A third tie bar 238 extends from the second portion 256 of the die paddle 250 along the third direction (negative X axis). A fourth tie bar 234 extends from the third portion 254 of the die paddle 250 along the second direction (positive X axis).

In examples of the present disclosure, the lead frame 200 further comprises one or more leads 270 extending from the third portion 254 of the die paddle 250 along a fourth direction (negative Y axis) opposite the first direction (positive Y axis). The lead frame 200 still further comprises a second plurality of leads 280 extending from the second portion 256 of the die paddle 250 along the fourth direction (negative Y axis).

Figure 3A:
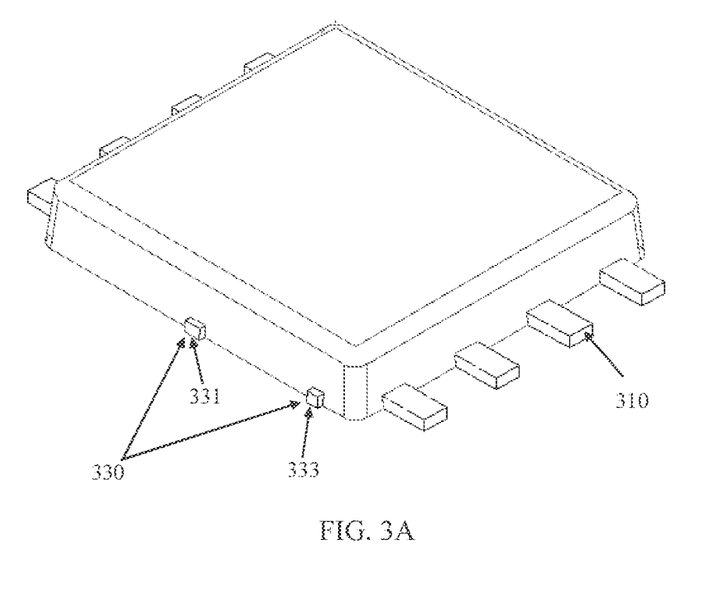
FIG. 3A shows a perspective view of a semiconductor package in examples of the present disclosure.

A respective end surface 310 of FIG. 3A of each lead of the first plurality of leads 260, the one or more leads 270, and the second plurality of leads 280 is plated with a metal. The respective end surface 310 is covered with the metal. A respective end surface 330 of FIG. 3A of each of the first tie bar 232, the second tie bar 236, the third tie bar 238, and the fourth tie bar 234 is not plated with the metal. The respective end surface 330 is exposed and is prone to be subjected to oxidation. In one example, the metal plated on the end surfaces 310 is tin.

In one example, a bottom 331 of FIG. 3A of the second tie bar is coplanar with a bottom 333 of FIG. 3A of the third tie bar. In another example, a bottom 341 of FIG. 3B of the second tie bar is disposed at a position lower than that of a bottom 343 of FIG. 3B of the third tie bar.

US patent application publication US2017/0271246 to Macheiner et al. discloses first and second unplated sidewalls 106a and 106b (see FIG. 1C of US patent application publication US2017/0271246). In examples of the present disclosure, the side surfaces 352 of FIG. 3B of the leads do not contain unplated windows similar to sidewalls 106a and 106b of FIG. 1C of US patent application publication US2017/0271246.

Figure 3B:
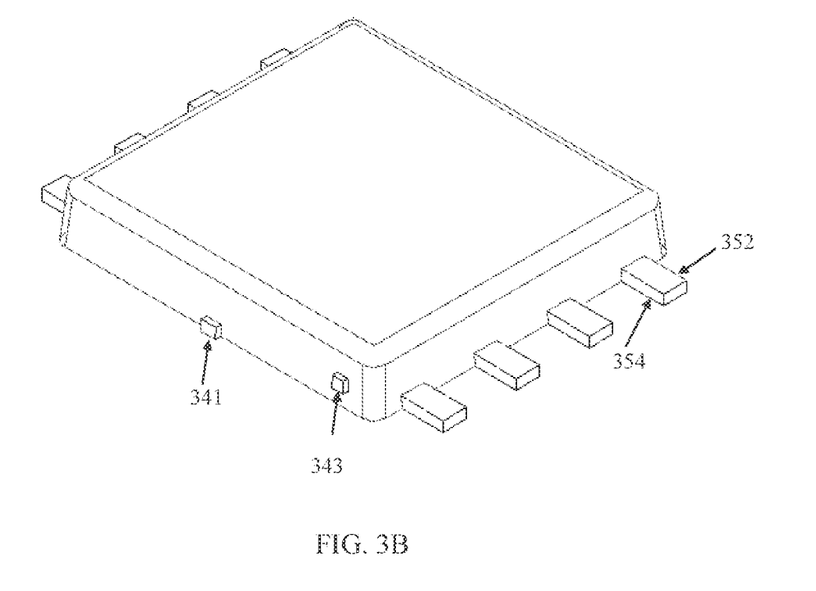
FIG. 3B shows a perspective view of another semiconductor package in examples of the present disclosure.

An entirety of a first respective side surface 352 of FIG. 3B of each lead of the first plurality of leads, the one or more leads, and the second plurality of leads is plated with the metal. An entirety of a second respective side surface 354 of FIG. 3B of each lead of the first plurality of leads, the one or more leads, and the second plurality of leads is plated with the metal. The second respective side surface 354 is opposite to the first respective side surface 352.

An entirety of a first respective side surface 352 of FIG. 3B of each lead of the first plurality of leads, the one or more leads, and the second plurality of leads excludes a window not covered with the metal. An entirety of a second respective side surface 354 of FIG. 3B of each lead of the first plurality of leads, the one or more leads, and the second plurality of leads excludes a window not covered with the metal. The second respective side surface 354 is opposite to the first respective side surface 352.

In one example, the chip 102 is a power semiconductor device such as a metal-oxide-semiconductor field-effect transistor (MOSFET) with a source electrode and a gate electrode on a top surface and a drain electrode on a bottom surface. The drain electrode is conductively attached to the first portion 252 of the die paddle 250. In another example, the chip 102 is an IC chip with a plurality of electrodes on a top surface.

Figure 4:
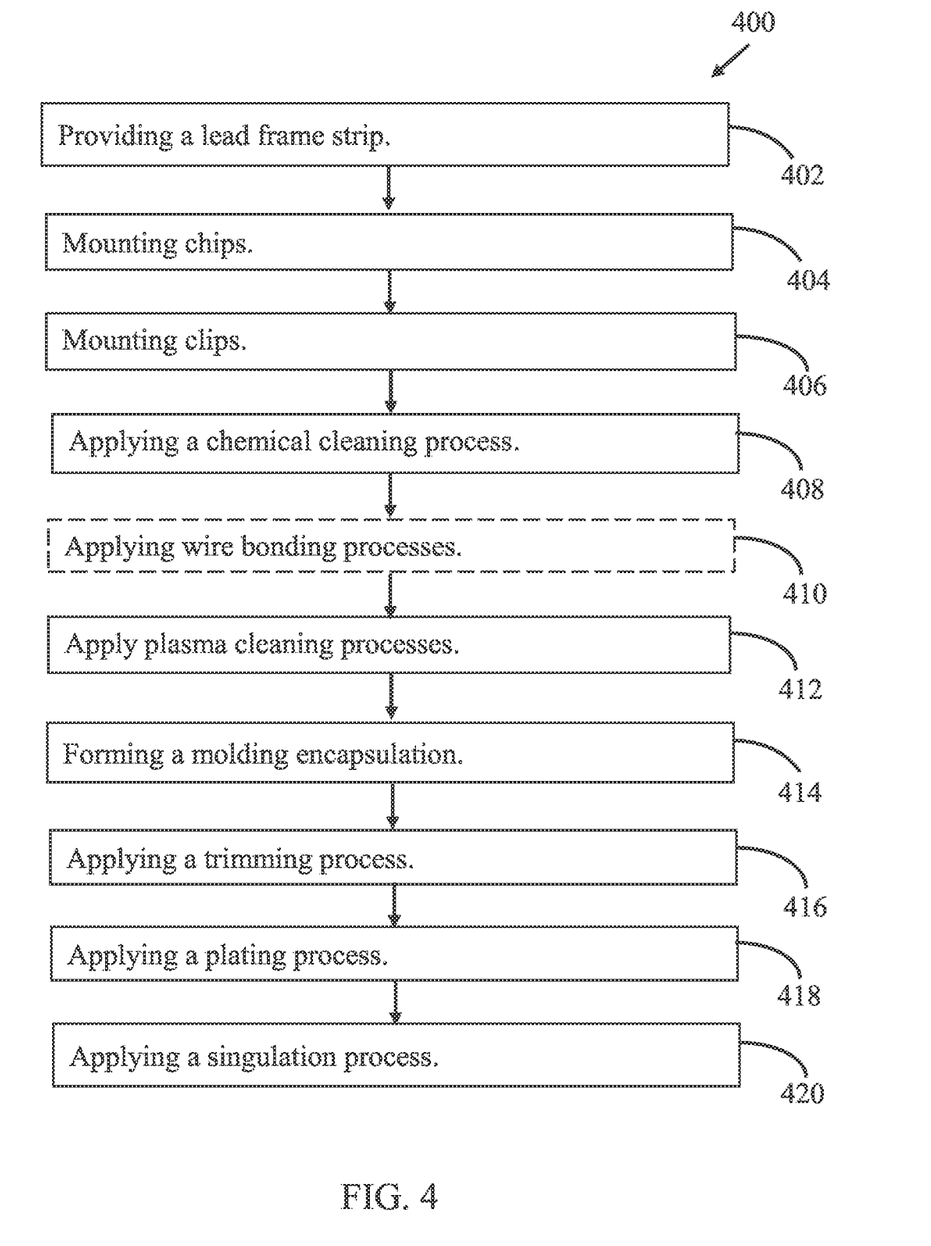
FIG. 4 is a flowchart of a process to develop a semiconductor package in examples of the present disclosure.

FIG. 4 is a flowchart of a process 400 to develop a semiconductor package in examples of the present disclosure. The process 400 may start from block 402. FIGS. 5A-5F show the top view of the corresponding steps.

Figure 5A:
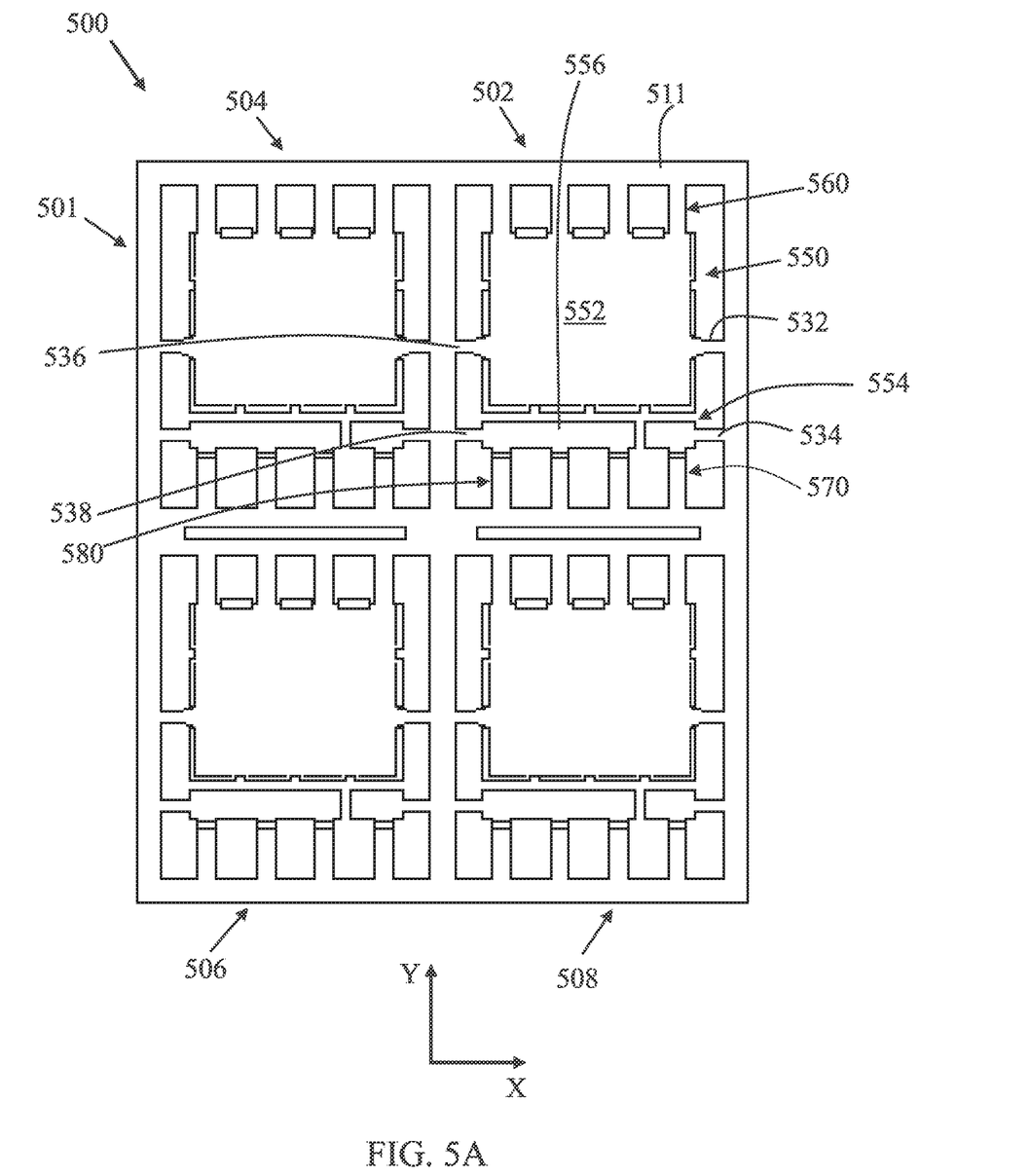
FIGS. 5A, 5B, 5C, 5D, 5E, and 5F show the steps of the process to fabricate a semiconductor package in examples of the present disclosure.

In block 402, referring now to FIGS. 5A-5F, a lead frame array 500 is provided. The lead frame array 500 comprises one or more lead frames 501. Though four lead frames are shown in FIG. 5A, the number of lead frames in a lead frame array may vary. In one example, the one or more lead frame 501 comprises four identical lead frames 502, 504, 506, and 508. The lead frame 502 comprises a peripheral frame 511, a die paddle 550, a first plurality of leads 560, one or more leads 570, a second plurality of leads 580, a first tie bar 532, a second tie bar 536, a third tie bar 538, and a fourth tie bar 534. In one example, the peripheral frame 511 is of a hollow rectangular shape. In another example, the peripheral frame 511 is of a rectangular ring shape.

The die paddle 550 comprises a first portion 552, a second portion 556, and a third portion 554. The first portion 552, the second portion 556, and the third portion 554 are electronically connected until the application of a singulation process of block 416.

Still in block 402, the first plurality of leads 560 extend from the first portion 552 of the die paddle 550 along a first direction (positive Y axis). A first tie bar 532 extends from the first portion 552 of the die paddle 550 along a second direction (positive X axis) perpendicular to the first direction (positive Y axis). A second tie bar 536 extends from the first portion 552 of the die paddle 550 along a third direction (negative X axis) opposite the second direction (positive X axis). A third tie bar 538 extends from the second portion 556 of the die paddle 550 along the third direction (negative X axis). A fourth tie bar 534 extends from the third portion 554 of the die paddle 550 along the second direction (positive X axis).

The one or more leads 570 extend from the third portion 554 of the die paddle 550 along a fourth direction (negative Y axis) opposite the first direction (positive Y axis). The second plurality of leads 580 extend from the second portion 556 of the die paddle 550 along the fourth direction (negative Y axis).

The first tie bar 532 and the second tie bar 536 are coplanar. The third tie bar 538 and the fourth tie bar 534 are coplanar. In one example, a bottom 331 of FIG. 3A of the second tie bar 536 is coplanar with a bottom 333 of FIG. 3A of the third tie bar 538. In another example, a bottom 341 of FIG. 3B of the second tie bar is disposed at a position lower than that of a bottom 343 of FIG. 3B of the third tie bar.

The first plurality of leads 560 are connected to the peripheral frame 511. The one or more leads 570 are connected to the peripheral frame 511. The second plurality of leads 580 are connected to the peripheral frame 511. Block 402 may be followed by block 404.

Figure 5B:
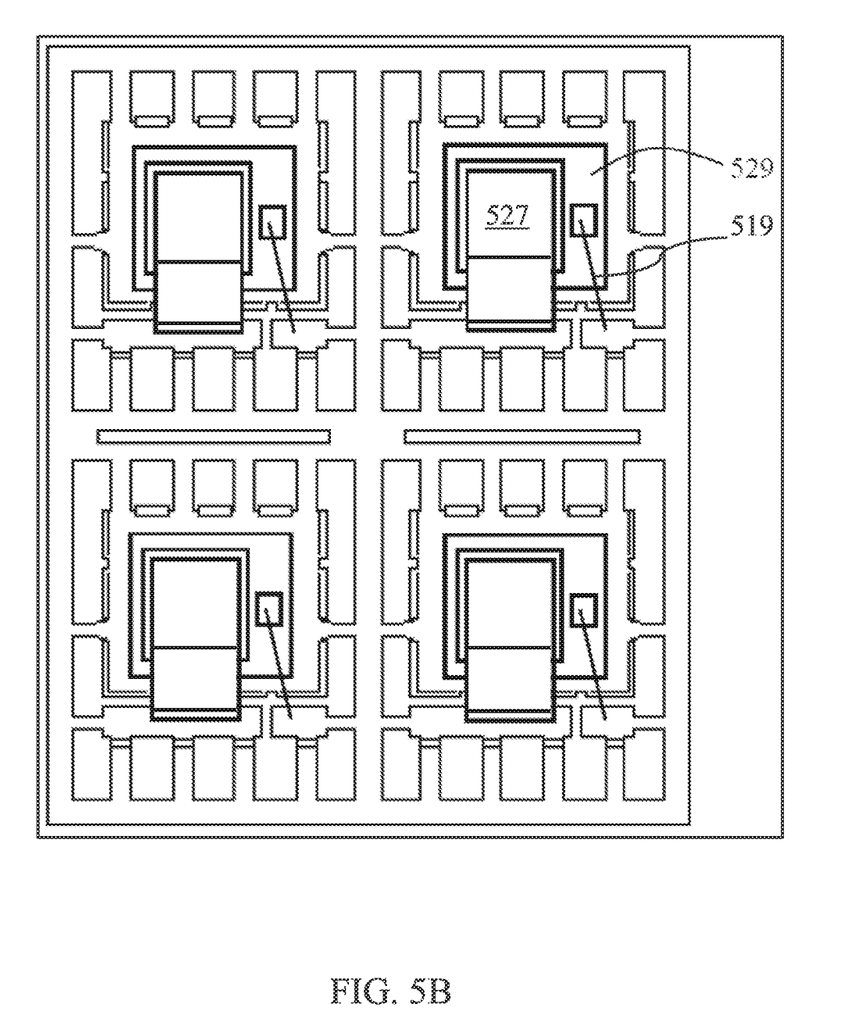

In block 404, referring now to FIG. 5B, one or more chips 529 are mounted on the die paddle 550. Block 404 may further comprises a sub-step of solder reflow so that the one or more chips 529 is mounted on the die paddle 550 by solders. In one example, the one or more chips 529 comprise a MOSFET with a source electrode and a gate electrode on a top surface and a drain electrode on a bottom surface. The drain electrode is conductively attached to the first portion 552 of the die paddle 550 in block 404. Block 404 may be followed by block 406.

In block 406, one or more metal connections 527 are applied so as to connect the one of more chips 529 to the second plurality of leads 580 and the one or more leads 570. In one example the metal connections 527 are conductive clips. Block 406 may be followed by block 408.

In block 408, a chemical cleaning process is applied. Block 408 may be followed by block 410 or block 412.

In optional block 410 (shown in dashed lines), a wire bonding process is applied. One or more wires 591 of FIG. 5B connect the chip 102 to the second portion 556 that connects to the one or more leads 570. Optional block 410 may be followed by block 412.

In block 412, one or more plasma cleaning processes are applied. Block 412 may be followed by block 414.

Figure 5C:
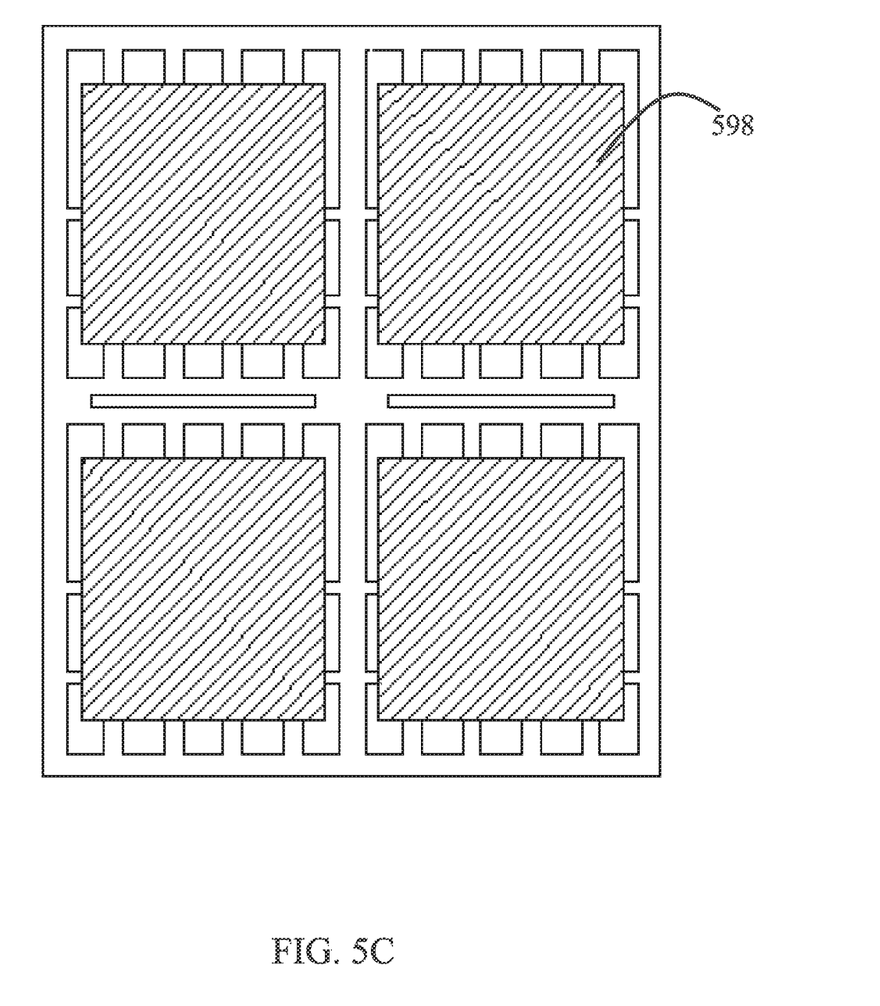

In block 414, referring now to FIG. 5C, a molding encapsulation 598 is formed. The molding encapsulation 598 encloses the chip 102 of FIG. 1. Block 414 may be followed by block 416.

Figure 5D:
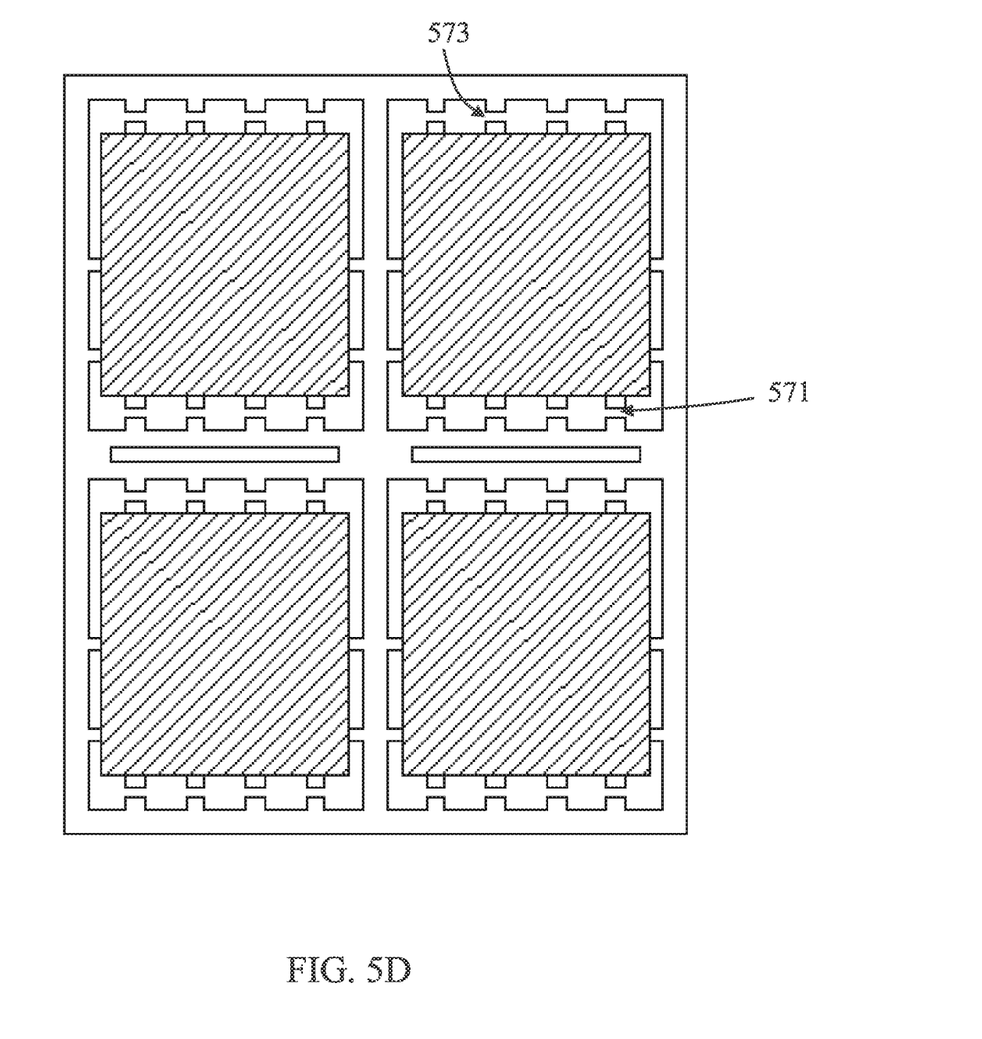

In block 416, referring now to FIG. 5D, a trimming process is applied. The first plurality of leads 560, the one or more leads 570, and the second plurality of leads 580 are cut so that the plurality of leads 560, the one or more leads 570, and the second plurality of leads 580 are separated from the peripheral frame 511 by gaps 571. The newly exposed end surfaces 573 of the leads will be covered by plated metal in the plating process of block 418. Block 416 may be followed by block 418.

Figure 5E:
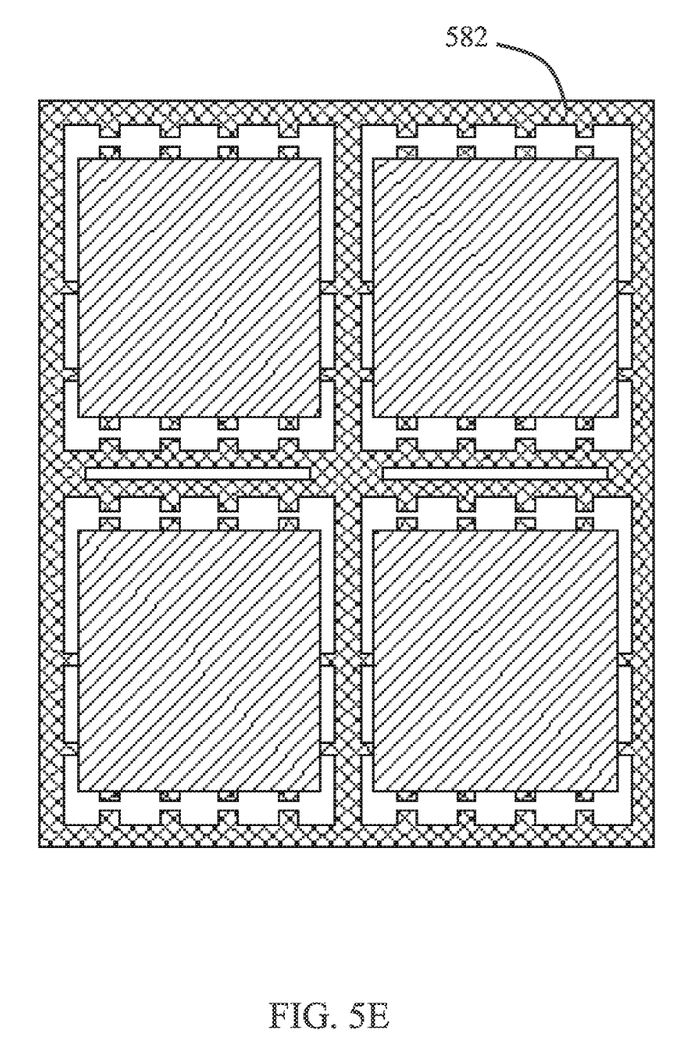

In block 418, referring now to FIG. 5E, portions of the lead frame 502, not covered by the molding encapsulation 598, are plated with a metal 582. The current for plating process flows through the first tie bar 532, the second tie bar 536, the third tie bar 538, and the fourth tie bar 534. As a result, entire lead of each lead is covered by the plated metal 582 on each and all surfaces exposed from the molding encapsulation 598, including the end surface 573 of each lead. Each of the first tie bar 532, the second tie bar 536, the third tie bar 538, and the fourth tie bar 534 is covered by the plated metal 582 on each and all surfaces exposed from the molding encapsulation 598. In one example, the metal 582 is a wettable metal. In examples of the present disclosure, the plated metal is tin, Sn. Block 418 may be followed by block 420.

Figure 5F:
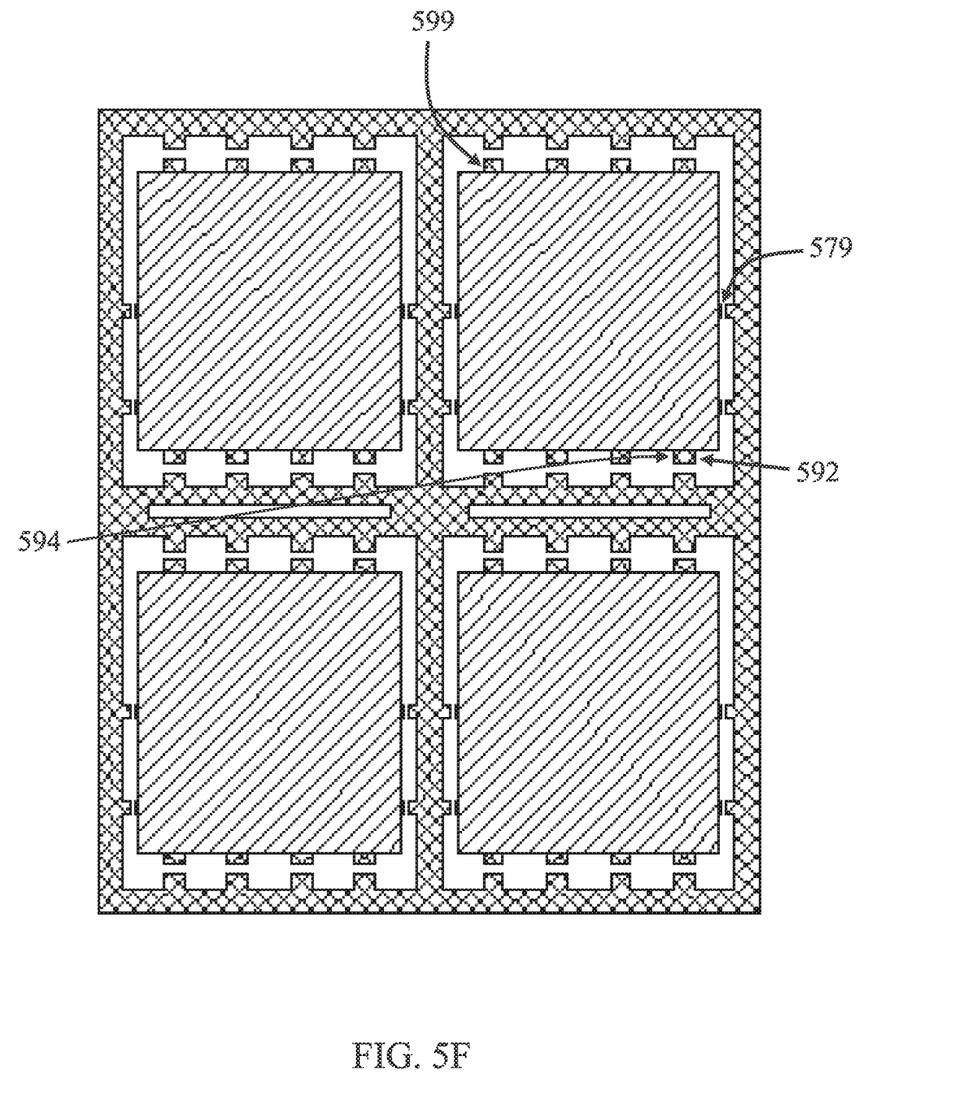

In block 420, referring now to FIG. 5F, a singulation process is applied so as to form a plurality of semiconductor packages 599. The first tie bar 532, the second tie bar 536, the third tie bar 538, and the fourth tie bar 534 are separated from the peripheral frame 511, by a plurality of gaps 579, so that the second portion 556 of the die paddle 550 is electrically isolated from the first portion 552 of the die paddle 550. The third portion 554 of the die paddle 550 is electrically isolated from the first portion 552 of the die paddle 550 and the second portion 556 of the die paddle 550. End surfaces of the first tie bar 532, the second tie bar 536, the third tie bar 538, and the fourth tie bar 534 are not covered by the plated metal 582.

An entirety of a first respective side surface 592, not covered by the molding encapsulation 598, of each lead of the first plurality of leads, the one or more leads, and the second plurality of leads is covered with the plated metal 582. An entirety of a second respective side surface 594, not covered by the molding encapsulation 598, of each lead of the first plurality of leads, the one or more leads, and the second plurality of leads is covered with the plated metal 582. The second respective side surface 594 is opposite to the first respective side surface 592. Side surfaces 592 and 594 of each exposed lead are flat and perpendicular to the end surface 573 of the corresponding lead.

Figure 6:
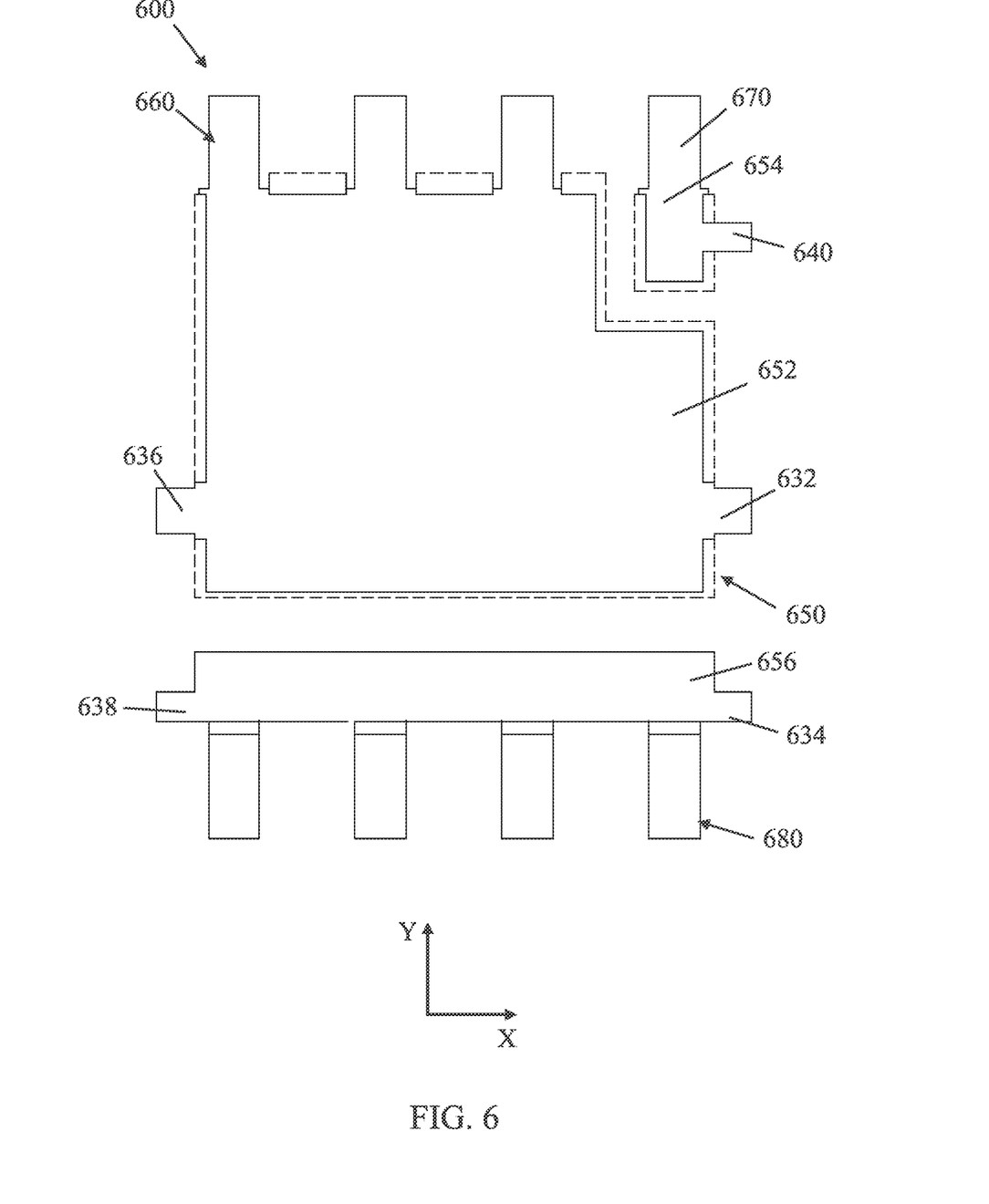
FIG. 6 shows a top view of another lead frame in examples of the present disclosure.

FIG. 6 shows a top view of another lead frame 600 in examples of the present disclosure for making the semiconductor package 100 with chip 102 flip-mounted on lead frame 600. The lead frame 600 comprises a die paddle 650 comprising a first portion 652, a second portion 656, and a third portion 654. The second portion 656 is electrically isolated from the first portion 652. The third portion 654 is electrically isolated from the first portion 652 and the second portion 656. In examples of the present disclosure, a top surface of an outer peripheral of the die paddle 250 is of a rectangular shape.

A first plurality of leads 660 extend from the first portion 652 of the die paddle 650 along a first direction (positive Y axis). A first tie bar 632 extends from the first portion 652 of the die paddle 650 along a second direction (positive X axis) perpendicular to the first direction (positive Y axis). A second tie bar 636 extends from the first portion 652 of the die paddle 650 along a third direction (negative X axis) opposite the second direction (positive X axis). A third tie bar 638 extends from the second portion 656 of the die paddle 650 along the third direction (negative X axis). A fourth tie bar 640 extends from the third portion 654 of the die paddle 650 along the second direction (positive X axis). A fifth tie bar 634 extends from the second portion 656 of the die paddle 650 along the second direction (positive X axis). The first tie bar 632 and the second tie bar 636 are coplanar. The third tie bar 638, the fourth tie bar 640 and the fifth tie bar 634 are coplanar. In one example, a bottom of the first tie bar 632 is coplanar with bottoms of the fourth tie bar 640 and fifth tie bar 634. In another example, a bottom of the first tie bar is disposed at a position lower than bottoms of the fourth tie bar 640 and fifth tie bar 634.

In examples of the present disclosure, the lead frame 600 further comprises one or more leads 670 extending from the third portion 654 of the die paddle 650 along the first direction (positive Y axis). The lead frame 600 still further comprises a second plurality of leads 680 extending from the second portion 656 of the die paddle 650 along the fourth direction (negative Y axis) opposite the first direction (positive Y axis).

The process of making semiconductor package 100 using lead frame 600 is similar to the process of FIG. 4 and FIGS. 5A-5F. In one example, the chip 102 is a MOSFET with a source electrode and a gate electrode on a top surface and a drain electrode on a bottom surface. The chip 102 is flipped and attached to the die paddle 650 with the source electrode conductively attached to the first portion 652 and the gate electrode conductively attached to the third portion 654.

Those of ordinary skill in the art may recognize that modifications of the embodiments disclosed herein are possible. For example, the directions of X and Y axes may be reversed, or a number of leads may vary. Other modifications may occur to those of ordinary skill in this art, and all such modifications are deemed to fall within the purview of the present invention, as defined by the claims.

The invention claimed is:

1. A semiconductor package comprising:
   a lead frame comprising
      a die paddle comprising
         a first portion;
         a second portion electrically isolated from the first portion; and
         a third portion electrically isolated from the first portion and the second portion;
      a first plurality of leads extending from the first portion of the die paddle along a first direction;
      a first tie bar extending from the first portion of the die paddle along a second direction perpendicular to the first direction;
      a second tie bar extending from the first portion of the die paddle along a third direction opposite the second direction;
      a third tie bar extending from the second portion of the die paddle along the third direction; and
   a semiconductor chip attached to the die paddle of the lead frame; and
   a molding encapsulation enclosing the chip;
   wherein a respective end surface of each lead of the first plurality of leads is plated with a metal; and
   wherein a respective end surface of each of the first tie bar, the second tie bar, and the third tie bar is not plated with the metal.

2. The semiconductor package of claim 1, wherein a bottom of the second tie bar is coplanar with a bottom of the third tie bar.

3. The semiconductor package of claim 1, wherein a bottom of the second tie bar is disposed at a position lower than that of a bottom of the third tie bar.

4. The semiconductor package of claim 1, wherein the lead frame further comprises a fourth tie bar extending from the third portion of the die paddle along the second direction, wherein an end surface of the fourth tie bar is not plated with the metal.

5. The semiconductor package of claim 4, wherein the lead frame further comprises
   additional one or more leads extending from the third portion of the die paddle along a fourth direction opposite the first direction; and
   a second plurality of leads extending from the second portion of the die paddle along the fourth direction;

wherein a respective end surface of each lead of the additional one or more leads and the second plurality of leads is plated with the metal.

6. The semiconductor package of claim 5, wherein an entirety of a first respective side surface, not covered by the molding encapsulation, of each lead of the first plurality of leads, the additional one or more leads, and the second plurality of leads is plated with the metal;
wherein an entirety of a second respective side surface, not covered by the molding encapsulation, of each lead of the first plurality of leads, the additional one or more leads, and the second plurality of leads is plated with the metal; and
wherein the second respective side surface is opposite to the first respective side surface.

7. The semiconductor package of claim 5, wherein the semiconductor chip comprises a metal-oxide-semiconductor field-effect transistor (MOSFET) comprising
a source electrode and a gate electrode on a top surface of the MOSFET; and
a drain electrode on a bottom surface of the MOSFET;
wherein the drain electrode is conductively attached to the first portion of the die paddle.

8. The semiconductor package of claim 1, wherein the lead frame further comprises
a fourth tie bar extending from the third portion of the die paddle along the second direction; and
a fifth tie bar extending from the second portion of the die paddle along the second direction; and
wherein an end surface of the fourth tie bar and an end surface of the fifth tie bar are not plated with the metal.

9. The semiconductor package of claim 8, wherein the lead frame further comprises
additional one or more leads extending from the third portion of the die paddle along the first direction; and
a second plurality of leads extending from the second portion of the die paddle along a fourth direction opposite the first direction;
wherein a respective end surface of each lead of the additional one or more leads and the second plurality of leads is plated with the metal.

10. The semiconductor package of claim 9, wherein the semiconductor chip comprises a metal-oxide-semiconductor field-effect transistor (MOSFET) comprising
a source electrode and a gate electrode on a top surface of the MOSFET; and
a drain electrode on a bottom surface of the MOSFET;
wherein the source electrode is conductively attached to the first portion of the die paddle and the gate electrode conductively attached to the third portion of the die paddle.

11. The semiconductor package of claim 1, wherein an entirety of a first respective side surface, not covered by the molding encapsulation, of each lead of the first plurality of leads is plated with the metal; and
wherein the first respective side surface of each lead of the first plurality of leads directly connects to the respective end surface of each lead of the first plurality of leads.

12. The semiconductor package of claim 1, wherein a top surface of an outer peripheral of the die paddle is of a rectangular shape; and wherein the first portion of the die paddle and the second portion of the die paddle have a same width.

13. The semiconductor package of claim 12, wherein the lead frame further comprises:
a fourth tie bar extending from the third portion of the die paddle along the second direction; and
a fifth tie bar extending from the second portion of the die paddle along the second direction.

\* \* \* \* \*